(12) United States Patent
Kang

(10) Patent No.: US 7,030,013 B2
(45) Date of Patent: Apr. 18, 2006

(54) METHOD FOR FABRICATING SEMICONDUCTOR DEVICE USING HIGH DIELECTRIC MATERIAL

(75) Inventor: Hyeok Su Kang, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 130 days.

(21) Appl. No.: 10/739,595

(22) Filed: Dec. 18, 2003

(65) Prior Publication Data

US 2004/0219754 A1   Nov. 4, 2004

(30) Foreign Application Priority Data

Apr. 30, 2003  (KR) .................... 10-2003-0027466

(51) Int. Cl.
*H01L 21/00*  (2006.01)

(52) U.S. Cl. .................... 438/653; 438/785; 438/765

(58) Field of Classification Search ............... 438/653, 438/785, 765, 763, 694

See application file for complete search history.

(56) References Cited

U.S. PATENT DOCUMENTS

| 6,072,207 | A | 6/2000 | Yoshimori et al. | |
|---|---|---|---|---|
| 6,080,592 | A | 6/2000 | Paz de Araujo et al. | |
| 6,580,137 | B1 | 6/2003 | Parke | |
| 6,624,093 | B1 * | 9/2003 | Lyman et al. | 438/785 |
| 6,642,066 | B1 * | 11/2003 | Halliyal et al. | 438/16 |
| 6,700,171 | B1 * | 3/2004 | Landheer et al. | 257/411 |
| 6,713,846 | B1 * | 3/2004 | Senzaki | 257/635 |
| 6,797,599 | B1 * | 9/2004 | Visokay et al. | 438/586 |
| 6,818,553 | B1 * | 11/2004 | Yu et al. | 438/648 |
| 2003/0207549 | A1 * | 11/2003 | Jenq | 438/582 |

* cited by examiner

Primary Examiner—Laura M. Schillinger
(74) Attorney, Agent, or Firm—Ladas & Parry LLP

(57) ABSTRACT

Disclosed is a method for fabricating a semiconductor device using high dielectric material. The method comprises the steps of: forming an Hf thin film on a silicon substrate; oxidizing the Hf thin film by performing an oxidizing process; and performing an annealing process after the oxidizing process, thereby forming a gate oxide film comprising an $HfSi_xO_y$ thin film and an $HfO_2$ thin film on the silicon substrate, in which "X" is 0.4~0.6 and "Y" is 1.5~2.5. Therefore, since a high dielectric material $HfO_2$, which is thicker than $SiO_2$, is used, leakage current caused by direct tunneling of $SiO_2$ can be prevented.

5 Claims, 6 Drawing Sheets (a)

(b)

METHOD FOR FABRICATING SEMICONDUCTOR DEVICE USING HIGH DIELECTRIC MATERIAL

BACKGROUND OF THE INVENTION

1. Field of the invention

The present invention relates to a method for fabricating a semiconductor device, and more particularly to a method for fabricating a semiconductor device in which high dielectric material $HfO_2/HfSi_xO_y$ is employed, wherein "X" is 0.4~0.6 and "Y" is 1.5~2.5.

2. Description of the Prior Art

According to Moore's law, semiconductor devices have been realized with the linewidth decrease of a MOSFET device and the thickness decrease of a $SiO_2$ film. That is, improving the integration rate and the capability of semiconductor devices through such decreases in size have been achieved, first of all, by decreasing the linewidth of a MOSFET device and the physical thickness of a $SiO_2$ film which is used as a gate oxide film.

However, when a $SiO_2$ film having a thickness of 20 Å or less is used in the prior art, leakage current increases due to quantum mechanic tunneling of electrons, so that application of a device is impossible. Particularly, in a case of storage devices such as a memory and so forth, leakage current increase in a gate oxide film has a decisively bad effect upon the reliability guarantee of the devices, so development of new materials has been required.

SUMMARY OF THE INVENTION

Accordingly, the present invention has been made to solve the above-mentioned problems occurring in the prior art, and an object of the present invention is to provide a method for fabricating a semiconductor device using high dielectric material $HfO_2$ thicker than $SiO_2$ as a gate oxide film, and thereby proving a semiconductor device capable of preventing leakage current caused by direct tunneling of $SiO_2$.

In order to accomplish this object, there is provided a method for fabricating a semiconductor device using high dielectric material, the method comprising the steps of: forming an Hf thin film on a silicon substrate; oxidizing the Hf thin film by performing an oxidizing process; and performing an annealing process after the oxidizing process, thereby forming a gate oxide film comprising an $HfSi_xO_y$ thin film and an $HfO_2$ thin film on the silicon substrate, in which "X" is 0.4~0.6 and "Y" is 1.5~2.5.

BRIEF DESCRIPTION OF THE DRAWINGS

The above and other objects, features and advantages of the present invention will be more apparent from the following detailed description taken in conjunction with the accompanying drawings, in which:

FIGS. 2A and 2B are TEM photographs of a semiconductor device using high dielectric material according to the present invention, in which FIG. 2A is a high-resolution TEM photograph before annealing of a gate oxide film, which an Hf metal thin film is deposited by a rf-magnetron sputtering method and then is oxidized, so as to have an $HfO_2/HfSi_xO_y$ multi-layer structure formed, and FIG. 2B is a high-resolution TEM photograph after annealing of the gate oxide film;

FIGS. 3A and 3B are graphs showing atomic concentration according to sputtering time, so as to explain the thickness decrease of an $HfSi_xO_y$ portion (flat area) compounded of Hf, O, and Si in a case of a gate oxide film having an $HfO_2/HfSi_xO_y$ multi-layer structure in a semiconductor device using high dielectric material according to the present invention, in which FIG. 3A is a graph before annealing and FIG. 3B is a graph after annealing;

DETAILED DESCRIPTION OF THE PREFERRED EMBODIMENTS

Figure 1A:
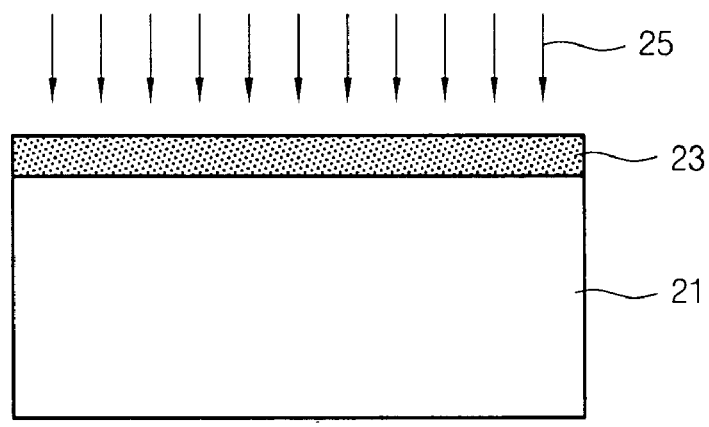
FIGS. 1A and 1B are cross-sectional views showing a process of a fabrication method of a semiconductor device using high dielectric material according to the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 1B:
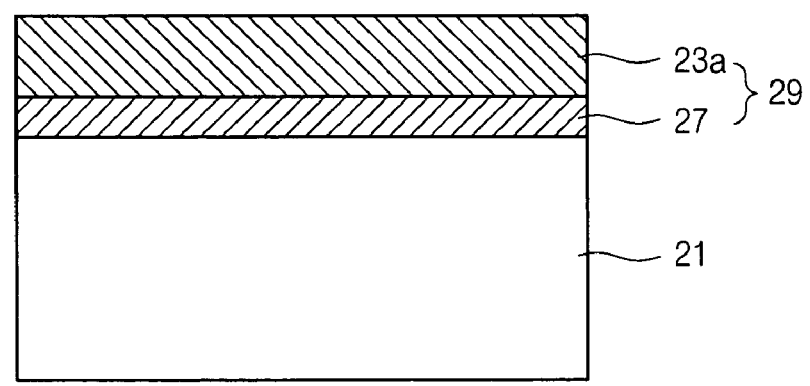

FIGS. 1A and 1B are cross-sectional views showing a process of a fabrication method of a semiconductor device using high dielectric material according to the present invention.

FIGS. 2A and 2B are TEM images of a semiconductor device using high dielectric material according to the present invention. FIG. 2A is a high-resolution TEM images before heat treatment of a gate oxide film, which an Hf metal thin film is deposited by nonreactive rf-magnetron sputtering method and then is oxidized, so as to have an $HfO_2/HfSi_xO_y$ multi-layer structure formed. FIG. 2B is a high-resolution TEM images after annealing of the gate oxide film.

FIGS. 3A and 3B are graphs showing atomic concentration according to sputtering time, so as to explain the thickness decrease of an $HfSi_xO_y$ portion (flat area) compounded of Hf, O, and Si in a case of a gate oxide film having an $HfO_2/HfSi_xO_y$ multi-layer structure in a semiconductor device using high dielectric material according to the present invention. FIG. 3A is a graph before annealing and FIG. 3B is a graph after annealing.

Figure 4:
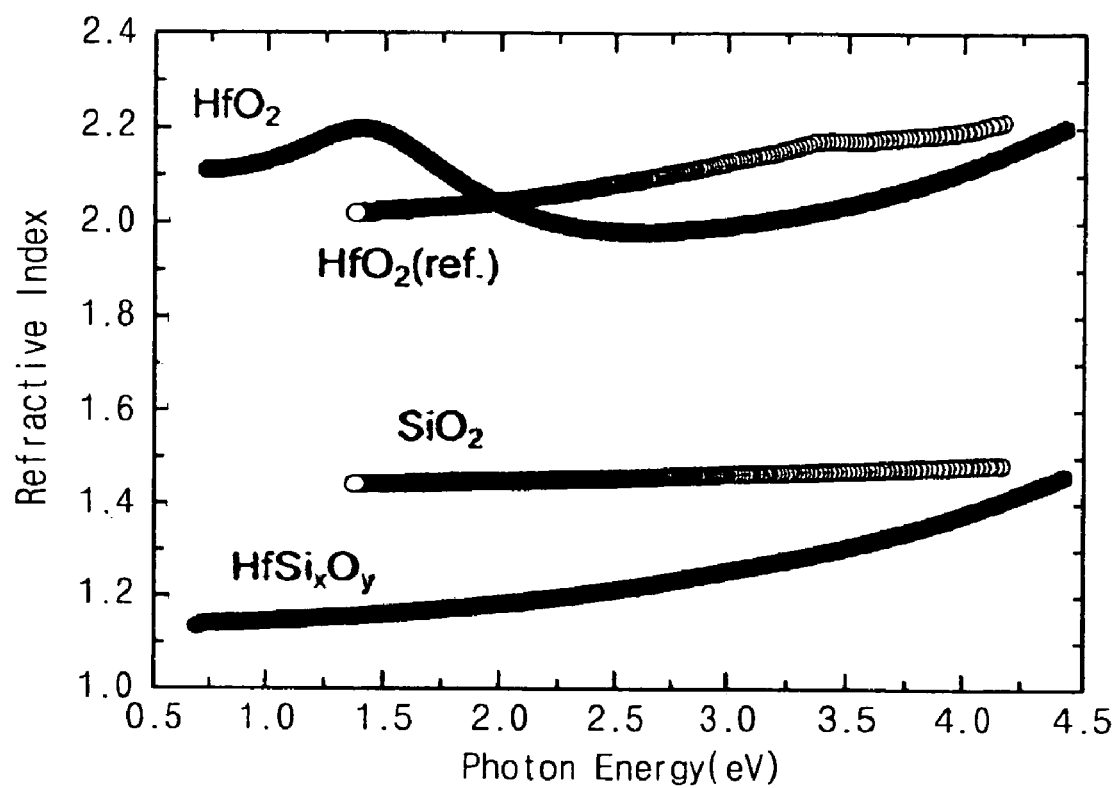
FIG. 4 is a graph showing refractive index according to photo energy in a method for fabricating a semiconductor device using a dielectric material according to the present invention.

FIG. 4 is a graph showing refractive index according to photo energy in a method for fabricating a semiconductor device using a dielectric material according to the present invention.

Figure 5:
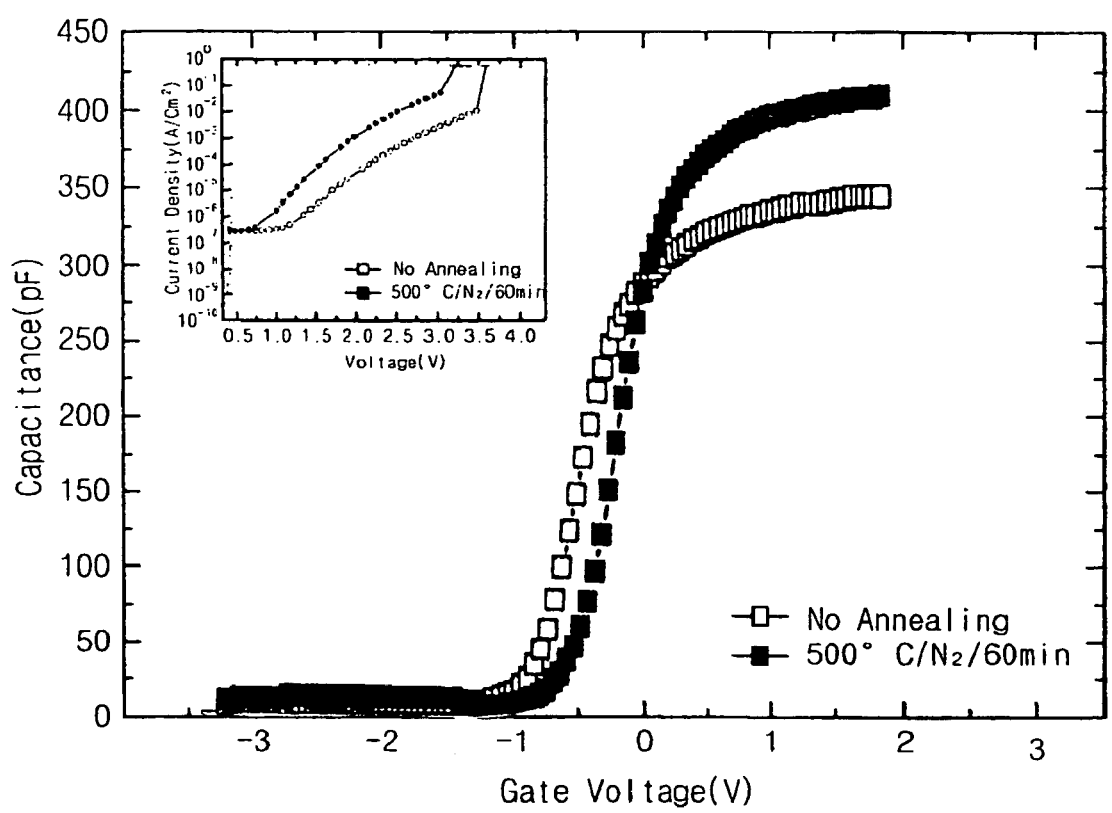
FIG. 5 is a graph showing capacitance according to gate voltage $V_G$, containing a smaller graph showing voltage to current density, before and after annealing of an Al—$HfO_2$/$HfSi_xO_y$—Si capacitor, in a method for fabricating a semiconductor device using a dielectric material according to the present invention.

FIG. 5 is a graph showing capacitance according to gate voltage $V_G$, containing a smaller graph showing voltage to current density, before and after annealing of an Al—$HfO_2$/$HfSi_xO_y$—Si capacitor, in a method for fabricating a semiconductor device using a dielectric material according to the present invention.

Figure 6:
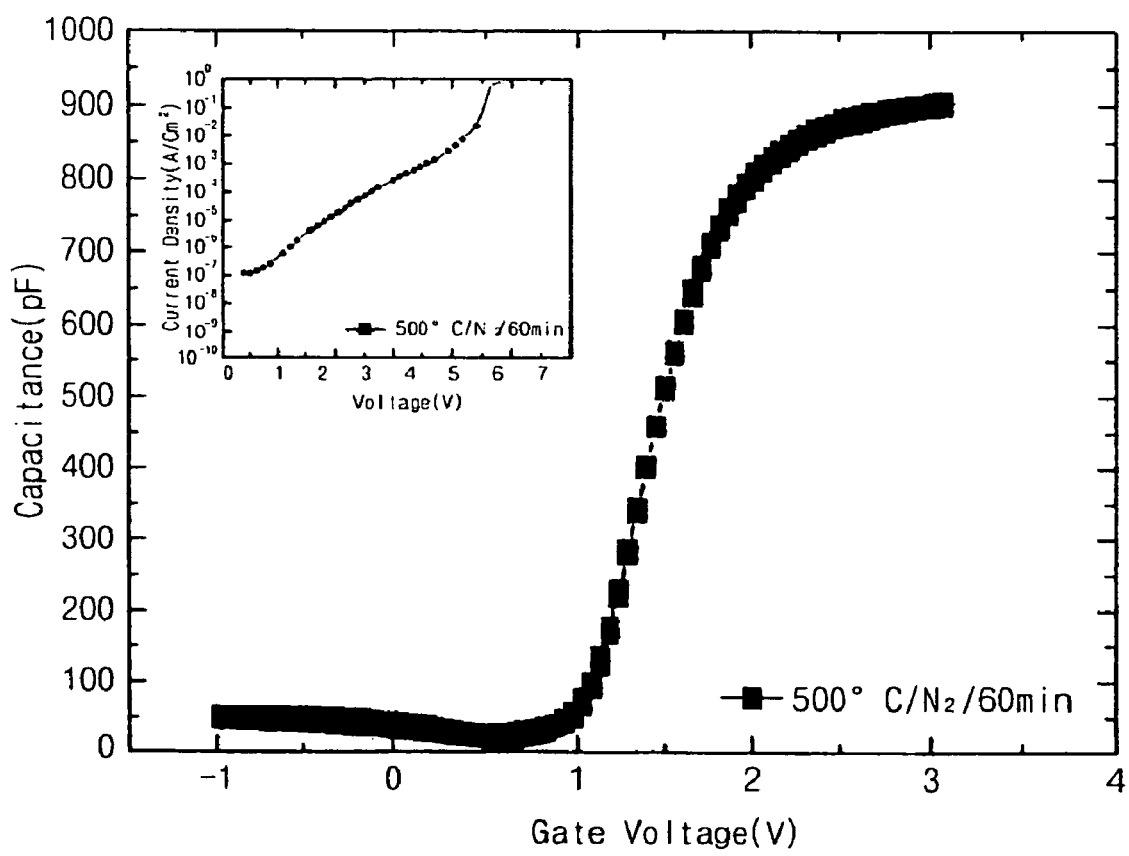
FIG. 6 is a graph showing capacitance according to gate voltage $V_G$, containing a smaller graph showing voltage to current density, after annealing of a Pd—$HfO_2$/$HfSi_xO_y$—Si capacitor, in a method for fabricating a semiconductor device using a dielectric material according to the present invention.

FIG. 6 is a graph showing capacitance according to gate voltage $V_G$, containing a smaller graph showing voltage to current density, after annealing of a Pd—$HfO_2$/$HfSi_xO_y$—Si capacitor, in a method for fabricating a semiconductor device using a dielectric material according to the present invention.

According to a method for fabricating a semiconductor device using a dielectric material according to the present invention, as shown in FIG. 1A, an Hf thin film 23 is deposited on a silicon substrate 21 using a nonreactive rf-magnetron sputtering method which has excellent electrical properties.

Then, as shown in FIG. 1B, after the Hf thin film 23 is deposited, an oxidation process is performed at a temperature of about 500° C. for 120 min in a furnace, and thereby an $HfO_2$ thin film 23a is formed. At this time, an Hf-silicate film, which is a thermally stable amorphous layer, that is, an $HfSi_xO_y$ thin film 27 is formed between $HfO_2$ and Si during the fabricating process of the $HfO_2$ thin film. Such $HfSi_xO_y$ film 27, which is an amorphous layer, has a smaller dielectric constant (~13) than an $HfO_2$ thin film, however, it performs the important function of preventing leakage current.

Subsequently, an $HfO_2$ thin film 23a and an $HfSi_xO_y$ thin film 27, wherein "X" is 0.4~0.6 and "Y" is 1.5~2.5, are annealed at a temperature of about 500° C. in $N_2$ ambient, thereby forming a gate oxide film 29 of a semiconductor device.

Next, although they are not shown in drawings, an electrode (not shown) using a metal such as Al, Pd, etc. is formed on the gate oxide film 29.

Figure 2:
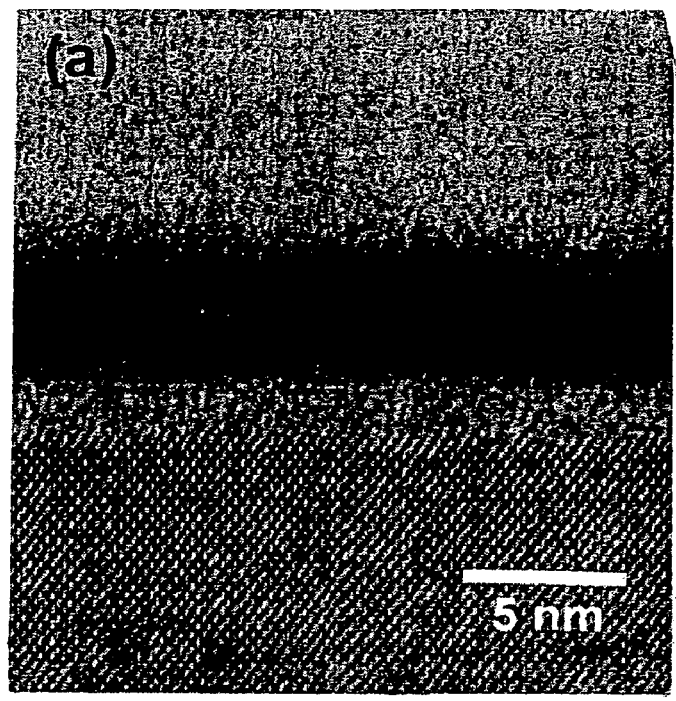
Figure 2:
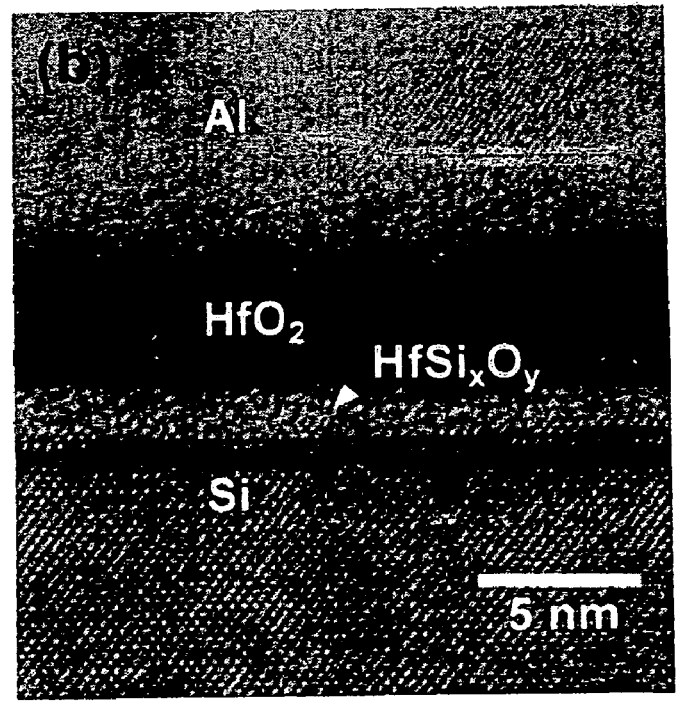
Figure 3:
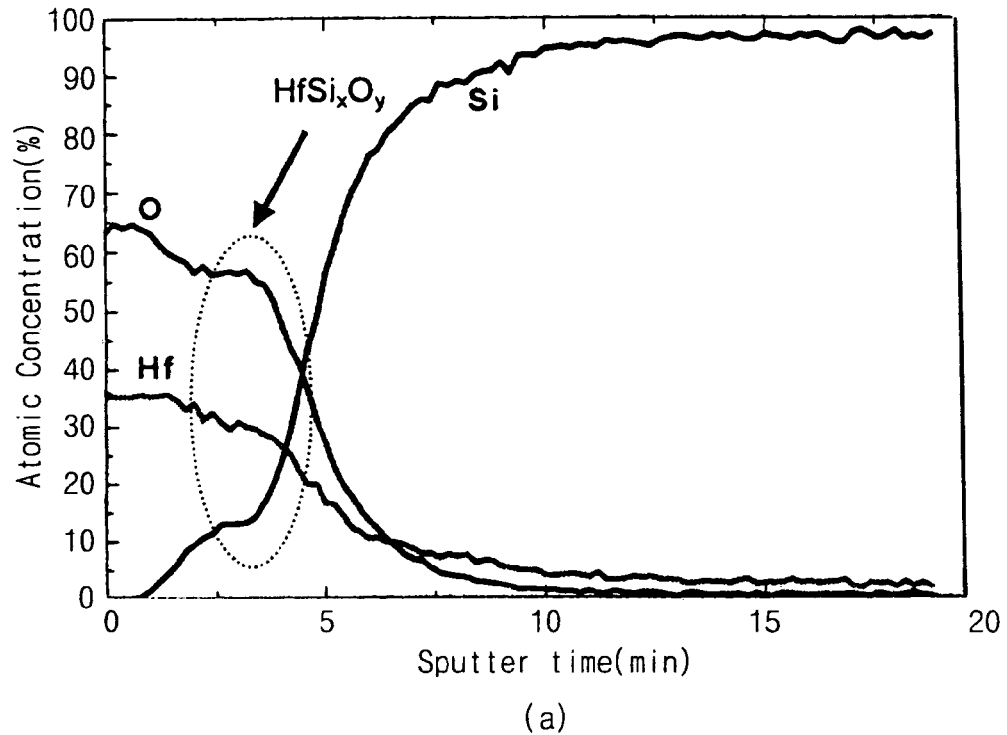
Figure 3:
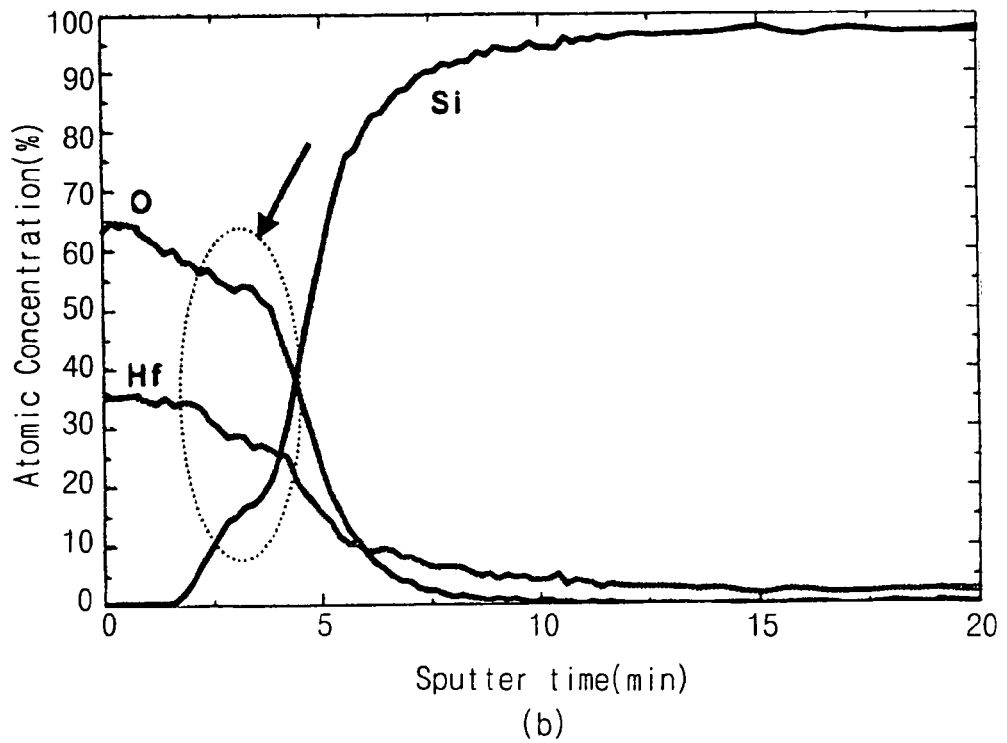

A phenomenon, in which the thickness of the $HfSi_xO_y$ thin film 27 decreases while the thickness of the $HfO_2$ thin film 23a increases through such an annealing process, can be understood well with reference to FIGS. 2 and 3 showing physical properties and FIGS. 5 and 6 showing electrical properties. Particularly, in a case of Al—$HfO_2$/$HfSi_xO_y$—Si capacitor shown in FIG. 5, after annealing, its capacitance increases owing to the thickness reduction of $HfSi_xO_y$ having a low dielectric constant of 13 or less, and also leakage current characteristics are obtained due to the existence of the amorphous $HfSi_xO_y$.

In other words, it is understood that a structural potential is formed by selective reaction of $HfO_2$ and $HfSi_xO_y$ during an oxidation and annealing. That is, owing to the diffusion of Si and O after annealing, the thickness of $HfO_2$ increases, while the thickness of the $HfSi_xO_y$ is reduced.

Also, as shown in FIG. 6, a Pd—$HfO_2$/$HfSi_xO_y$—Si capacitor, which employs a palladium electrode having a low activity, has an equivalent oxide thickness (EOT) of 14 Å and generates a leakage current of about $5 \times 10^{-3}$ A/cm$^2$ at 2V after compensating the flatband voltage of 1 V(i.e., measured at 3 V), which confirms that the Pb—$HfO_2$/$HfSi_xO_y$—Si capacitor is superior to an Al—$HfO_2$/$HfSi_xO_y$—Si capacitor.

In order to show that not an $SiO_2$ layer but an $HfSi_xO_y$ layer is generated as an amorphous layer between an $HfO_2$ film and an Si substrate, FIG. 4 shows comparison of a refractive index of the $HfSi_xO_y$ layer with an existing refractive index of the $SiO_2$ layer which has been already reported. The refractive index of a thin film according to the present invention is measured in the $HfO_2$ layer and the interface layer thereof by spectroscopic ellipsometry (SE) analysis for photon energies ranging from 0.7 to 4.5 eV, in which a used sample has been oxidized in $O_2$ ambient and then annealed in $N_2$ ambient.

In comparison with the refractive indexes of $SiO_2$ and $HfO_2$ which have been generally known, the refractive index of the $HfO_2$ layer of oxidized thin film is similar to a reported refractive index of $HfO_2$, while the refractive index of the interface layer thereof shows a difference from a reported refractive index of $SiO_2$. This implies that an amorphous interface layer shown in the TEM images comprises not only $SiO_2$ but is a compound of Hf-silicate or $SiO_2$, $HfO_2$, Hf, etc., as understood by an AES analysis,.

As described above, with a semiconductor device fabricated using high dielectric material according to the present invention, the reliability of the device can be improved owing to the use of high dielectric material $HfO_2$, while it is difficult to use a $SiO_2$ film of 0.1 µm or less, which is the conventional gate oxide film, as a semiconductor device. That is, since thick $HfO_2$ is used so as to enable the effect of thin $SiO_2$ to be obtained, leakage current can be reduced. Furthermore, the number of net dies per wafer can increase, so that the integration rate of a device can be improved.

Also, in a case of constructing a transistor with a semiconductor device fabricated according to the present invention, driving current can increase due to more electric charge in an inversion region, and a short channel effect and sub-threshold current can be reduced because electric charge is easily controlled.

In addition, a transistor can be stably operated with a low threshold voltage.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device using high dielectric material, the method comprising the steps of:
   forming an Hf thin film on a silicon substrate;
   oxidizing the Hf thin film to form a $HfO_2$, thin film and a $HfSi_xO_y$ thin film which construct a pate oxide film on the silicon substrate, in which "x" is 0.4~0.6 and "y" is 1.5~2.5; and
   annealing the $HfO_2$ thin film and the $HfSi_xO_y$ thin film to increase the thickness of $HfO_2$ thin film and to decrease the thickness of $HfSi_xO_y$ thin film after oxidizing step.

2. The method as claimed in claim 1, wherein the Hf thin film is deposited by means of a sputtering method.

3. The method as claimed in claim 1, wherein the oxidizing process is performed for about 120 minutes in a furnace at a temperature of about 500° C.

4. The method as claimed in claim 1 wherein the annealing process is performed for about 60 minutes in a furnace at a temperature of about 500° C. under $N_2$ ambient.

5. The method as claimed in claim 1, further comprising a step of forming a conductive electrode on the gate oxide film, the conductive electrode including Al or Pd.

* * * * *